(12) United States Patent
Solazzo et al.

(10) Patent No.: US 10,953,740 B2
(45) Date of Patent: Mar. 23, 2021

(54) MAGNETIC FIELD BASED DETECTION OF THE OPERATING STATUS OF AIR FLAP

(71) Applicant: Röchling Automotive SE & Co. KG, Mannheim (DE)

(72) Inventors: Domenico Solazzo, Worms (DE); Anton Pfeifer, Leifers (IT)

(73) Assignee: Röchling Automotive SE & Co. KG, Mannheim (DE)

(*) Notice: Subject to any disclaimer, the term of this patent is extended or adjusted under 35 U.S.C. 154(b) by 205 days.

(21) Appl. No.: 15/708,508

(22) Filed: Sep. 19, 2017

(65) Prior Publication Data

US 2018/0086199 A1    Mar. 29, 2018

(30) Foreign Application Priority Data

Sep. 23, 2016 (DE) ..................... 10 2016 218 391.5

(51) Int. Cl.
*B60K 11/08* (2006.01)
*G01R 33/07* (2006.01)

(52) U.S. Cl.
CPC .......... *B60K 11/085* (2013.01); *G01R 33/07* (2013.01); *Y02T 10/88* (2013.01)

(58) Field of Classification Search
USPC ............................................................. 701/49
See application file for complete search history.

(56) References Cited

U.S. PATENT DOCUMENTS

| 5,132,944 | A | * | 7/1992 | Berg | .................. | G11B 7/08576 369/13.34 |
| 5,444,369 | A | | 8/1995 | Luetzow | | |

(Continued)

FOREIGN PATENT DOCUMENTS

| DE | 102009034089 A1 | 1/2011 |
| DE | 102009039523 A1 | 3/2011 |

(Continued)

OTHER PUBLICATIONS

Google Translate English Translation of DE102009039523A1 to Bernat entitled "Air supply device for motor vehicle for supply of air into passenger cabin, has air supply channel with air outlet in passenger cabin" (Jul. 15, 2019)(https://patents.google.com/patent/DE102009039523A1/en?oq=102009039523).*

(Continued)

*Primary Examiner* — Jean Paul Cass
(74) *Attorney, Agent, or Firm* — Rankin, Hill & Clark LLP; Gregory S. Vickers

(57) ABSTRACT

An arrangement of air flaps for a motor vehicle, comprising an air flap frame which surrounds a through-flow opening, as well as at least one air flap which is movably mounted on the air flap frame, for changing the effective through-flow area of said through-flow opening, said at least one air flap at least protruding into the through-flow opening and preferably extending across said opening; said arrangement of air flaps including a Hall effect sensor and a detection section comprising magnetizable or permanently magnetized material and which cooperates in such a manner with a detecting section of the Hall effect sensor, the Hall effector sensor that detects a magnetic field emanating from the detection section, emits a detection signal when the at least one air flap is in a prescribed reference position relative to the air flap frame, which is different from a detection signal emitted by the Hall effect sensor when the at least one air flap is not in the prescribed position.

14 Claims, 2 Drawing Sheets

(56) References Cited

U.S. PATENT DOCUMENTS

| | | | | |
|---|---|---|---|---|
| 5,908,217 | A * | 6/1999 | Englar | B62D 37/02 296/180.1 |
| 6,506,605 | B1 * | 1/2003 | Allen | B01J 23/34 436/37 |
| 6,948,383 | B2 | 9/2005 | Wilczek | |
| 7,265,539 | B2 | 9/2007 | Rutkowski | |
| 7,784,576 | B2 * | 8/2010 | Guilfoyle | B60R 19/48 180/68.1 |
| 8,025,045 | B2 * | 9/2011 | Pettersson | B60K 11/085 123/568.12 |
| 8,256,387 | B2 * | 9/2012 | Taylor | F01P 7/10 123/41.05 |
| 8,281,754 | B2 * | 10/2012 | Saida | F01P 7/12 123/41.04 |
| 8,302,714 | B2 * | 11/2012 | Charnesky | B60K 11/085 180/68.1 |
| 8,316,974 | B2 * | 11/2012 | Coel | B60K 11/085 180/68.1 |
| 8,365,854 | B2 * | 2/2013 | Lee | B60K 11/00 180/68.1 |
| 8,434,579 | B2 * | 5/2013 | Widmer | B62D 25/084 180/68.1 |
| 8,443,921 | B2 * | 5/2013 | Charnesky | F01P 7/08 180/68.1 |
| 8,517,130 | B2 * | 8/2013 | Sakai | F01P 11/10 180/68.1 |
| 8,571,749 | B2 * | 10/2013 | Kawato | B60K 11/085 701/29.2 |
| 8,646,552 | B2 * | 2/2014 | Evans | B60R 19/18 180/68.1 |
| 8,667,931 | B2 * | 3/2014 | Kerns | F01P 7/10 123/41.05 |
| 8,744,666 | B2 * | 6/2014 | Switkes | G08G 1/166 701/28 |
| 8,833,498 | B2 * | 9/2014 | Charnesky | F01P 11/20 180/68.1 |
| 9,103,265 | B2 | 8/2015 | Okamoto | |
| 9,662,963 | B2 | 5/2017 | Schneider | |
| 9,664,497 | B2 | 5/2017 | Kerdraon | |
| 2003/0195046 | A1 * | 10/2003 | Bartsch | F41G 3/2683 463/49 |
| 2003/0201208 | A1 * | 10/2003 | Koch | A61K 49/1875 209/39 |
| 2014/0163664 | A1 * | 6/2014 | Goldsmith | A61B 17/12181 623/1.11 |
| 2015/0272575 | A1 * | 10/2015 | Leimbach | A61B 17/072 227/175.3 |
| 2015/0291792 | A1 | 10/2015 | Maikisch | |
| 2015/0298539 | A1 | 10/2015 | Solazzo | |
| 2016/0047363 | A1 * | 2/2016 | Alacqua | F16K 31/025 251/213 |
| 2016/0153846 | A1 * | 6/2016 | Inoue | G01L 1/2287 73/862.632 |
| 2017/0336273 | A1 * | 11/2017 | Elangovan | A43B 17/006 |
| 2018/0086199 | A1 * | 3/2018 | Solazzo | B60K 11/085 |
| 2018/0132850 | A1 * | 5/2018 | Leimbach | A61B 90/98 |
| 2019/0154439 | A1 * | 5/2019 | Binder | G01S 15/08 |
| 2019/0182415 | A1 * | 6/2019 | Sivan | G06F 3/013 |
| 2019/0200547 | A1 * | 7/2019 | Marsano | G01W 1/14 |
| 2019/0206565 | A1 * | 7/2019 | Shelton, IV | A61B 34/74 |

FOREIGN PATENT DOCUMENTS

| | | | |
|---|---|---|---|
| DE | 102012104722 A1 * | 12/2012 | B60H 1/00857 |
| GB | 2261517 A * | 5/1993 | G01K 7/38 |

OTHER PUBLICATIONS

Google Patent English Translation of DE102012104722B4 to Olaf Uhlenbusch (downloaded on Jan. 9, 2019)(pub. on Dec. 27, 2012).*

Machine Translation of KR20170119995A (2017).*

German Search Report for corresponding DE 10 2016 218 391.5 dated May 10, 2017, 11 pgs.

Espacenet Bibliographic data:DE102009034089 (A1), Published Jan. 27. 2011, 1pg.

Espacenet Bibliographic data:DE102009039523 (A1), Published Mar. 10, 2011, 2pgs.

* cited by examiner

MAGNETIC FIELD BASED DETECTION OF THE OPERATING STATUS OF AIR FLAP

The present invention relates to an arrangement of air flaps for a motor vehicle, comprising an air flap frame which surrounds a through-flow opening, as well as at least one air flap which is movably mounted on the air flap frame, for changing the effective through-flow area of said through-flow opening, said at least one air flap protruding at least to some extent into the through-flow opening. Preferably the at least one air flap extends across the entire through-flow opening, so that the movement of the air flap(s) will bring about the maximum amount of change in the effective through-flow area of said through-flow opening.

BACKGROUND OF THE INVENTION

An arrangement of air flaps of this general type is known for example from DE 10 2012 213992 A. Such an arrangement of air flaps is generally employed on the front of the vehicle, in order to change the amount of convective cooling air passing through the through-flow intake opening, thereby changing the convective cooling which takes place downstream of the through-flow opening, namely in the engine compartment. This can shorten phases for warming up of the internal combustion engine to nominal operating temperature following a cold start, and thereby can reduce emissions of pollutants into the environment.

SUMMARY OF THE INVENTION

It is an object of the present invention to make the verification of the generic functionality of the arrangement of air flaps by means of an onboard diagnosis system possible.

This object and others are achieved according to the present invention by a generic arrangement of air flaps which exhibits a Hall effect sensor and a detection section. The detection section comprises magnetizable or permanently magnetized material, and cooperates with the detection area of the Hall effect sensor in such a manner that the Hall effect sensor that detects a magnetic field emanating from the detection section emits a detection signal when the at least one air flap is in a prescribed reference position relative to the air flap frame which is different from the detection signal emitted by the Hall effect sensor when the at least one air flap is not in the prescribed position.

Thus, the basic concept of the present invention is therefore to employ a Hall effect sensor to measure the magnetizable or permanently magnetized material of the magnetic flux density in a section of the arrangement of air flaps, whereby this material is foreseen as a detection section in the arrangement of air flaps in such a manner that the magnetic flux density, at least depending on the capture of the reference position, changes depending on the position of the at least one air flap relative to the air flap frame. Based on the change in the magnetic flux density, the detection signal emitted by the Hall effect sensor when the at least one air flap is in the prescribed reference position will be different from the detection signal emitted by the Hall effect sensor when the at least one air flap is not in the prescribed reference position. If the material of the detection section is magnetizable but not permanently magnetized, the magnetizable material should then be magnetized for the duration of the capture of the reference position when the at least one air flap is in the prescribed reference position.

In principle, the detection section may initially be a permanently magnetized section. It may then beforeseen, e.g., directly on the at least one air flap, and may move together with the air flap(s) relative to the air flap frame. The Hall effect sensor may be disposed such that, via the magnetic field emanating from the permanently magnetized detection section, the Hall effect sensor detects whether the at least one air flap is or is not in the prescribed reference position, e.g. because the detecting area of the Hall effect sensor, at its mounting location, only detects a magnetic stray field of the permanently magnetized detection section of the at least one air flap when the same is in the predetermined reference position. The at least one air flap can have a magnetic permanent magnet region comprised of permanently magnetized material, wherewith the permanent magnet region of the at least one air flap is the detection section.

The detection section, in the form of a magnetizable or permanently magnetized region, may also be disposed on another component of the arrangement of air flaps than the at least one air flap, e.g. on the air flap frame. The term "disposed on the air flap frame" will be understood in this context to mean that the detection section is provided directly on the air flap frame or is provided via a component which is separate from the air flap frame but is fixed to and connected to the air flap frame.

The detection section may be fabricated commonly with or separately from the air flap frame. Then the system can accurately detect whether the at least one air flap is in the predetermined reference position; this is accomplished, e.g., in that a region of the at least one air flap, which region is comprised of magnetizable or permanently magnetized material, is in magnetic continuity with the detection section when the at least one air flap is in the predetermined reference position. At least one of the two regions (the: detection section on the air flap frame and the detection section on the at least one air flap, which latter region is comprised of magnetizable or permanently magnetized material) must be permanently magnetized so that a magnetic flux density can be detected by the Hall effect sensor.

Thus, preferably, the closed position of the at least one air flap, in which the effective through-flow area of the through-flow opening is maximally reduced, is the prescribed reference position. Under these circumstances, the permanent magnet region may be connected to a detection section formed on the air flap frame, in particular may be in physical contact with the detection section, which contact will have the characteristic of low magnetic resistance.

The provision of the detection section on the air flap frame has the advantage that, despite that fact that the through-flow opening may have a plurality of parts, only a single Hall effect sensor is needed to detect the proper functionality of the air flaps. The disposition of the detection section and the region formed of magnetizable or permanently magnetized material on the at least one air flap, in magnetic continuity, has the consequence that the magnetic field strength, and thus the magnetic flux density which is detected by the Hall effect sensor, is changed, along the entire region which is in magnetic continuity and thus also is in the detection section detected by the Hall effect sensor, so that the Hall effect sensor may be permissibly be disposed in a location which is out of the way of the at least one air flap. This can be useful, for protecting the Hall effect sensor, because the sensor can be disposed farther from the through-flow opening and therefore will not be appreciably burdened by soils, and particles of appreciable size, which may be carried in by the air streams due to driving.

Ordinarily, the arrangement of air flaps has a plurality of air flaps. Each of these is preferably swingable around a swing axis which extends parallel to the longitudinal axis of the air flap. The air flaps themselves preferably have lamellar shape. If the arrangement of air flaps is comprised of a plurality of such air flaps, preferably the slats are coupled for common movement relative to the air flap frame, so that only one actuator is needed to adjust the plurality of air flaps. To provide reliable detection of the proper functionality of the plurality of air flaps, preferably each of such slats has a "magnetizing region" with magnetizable or permanently magnetized material. To facilitate the detection of the proper functioning of the plurality of air flaps, as such detection has been described above, the magnetizing regions of the plurality of air flaps are in a condition of magnetic continuity when they are in the prescribed reference position.

If the detection section consists of one of the magnetizing regions of the plurality of air flaps, at least one such magnetizing region is permanently magnetized, to form the above-described permanent magnet region.

Then, when the detection section is formed on the air flap frame, it can be permanently magnetized, so that it is sufficient when the magnetizing portions of the plurality of air flaps are in magnetic continuity not only with each other but also with the detection section when the air flaps are in the predetermined reference position. This also changes the magnetic flux density of the permanently magnetized detection section on the air flap frame, so that a Hall effect sensor may be employed to determine the proper functioning of the plurality of air flaps. However, the detection section does not need to be permanently magnetized provided that at least one of the "magnetizing regions" of the air flaps is permanently magnetized.

The term "proper functioning" is understood to mean a status in which one can determine that the air flaps when subjected to control means are moved from their prescribed reference position, and again (when subjected to control means) said slats have been returned to said prescribed reference position. As soon as one of the plurality of air flaps does not occupy the prescribed reference position as intended, but rather is in a different position, this will mean that not all of the magnetizing regions of the plurality of air flaps will be in magnetic continuity, and therefore the detecting region of the Hall effect sensor will output a different signal (different Hall voltage) than it would output if all the air flaps in the plurality of air flaps occupied the prescribed reference position. Thus a single Hall effect sensor can suffice to reliably monitor the proper functioning of a plurality of air flaps.

The greater the number of magnetizing regions of the individual air flaps which are permanently magnetized, the more reliable is the detection of the functionality of the system, because the magnetic flux density which prevails at the detection section will be greater when magnetic continuity is achieved between said magnetizing regions. Therefore it is advantageous if the "magnetizing region" of at least one of the air flaps, preferably of a plurality of the air flaps, particularly preferably of all of the air flaps in the plurality of air flaps, is comprised of permanently magnetized material.

The term "plurality of air flaps" as used in the present Application is understood to designate not necessarily all of the air flaps which are provided on the vehicle or on an air flap frame; however, it is preferable if all of the air flaps of an arrangement of air flaps which are provided on a given air flap frame are configured (or modified so as to be configured) in accordance with the present Application.

In order to further improve the ability to detect the proper functioning of at least one air flap in the arrangement of air flaps, it is preferable if the arrangement of air flaps is comprised of a plurality of regions comprised of magnetizable or permanently magnetized material, of which at least one such region is comprised of permanently magnetized material, wherein the plurality of regions have magnetic continuity such that they form a closed magnetic circuit, when the at least one air flap is in its prescribed reference position. At least one of the plurality of regions may be formed on the air flap frame itself and at least one such region may be formed on the at least one air flap. It is necessary that at least one of said regions be in the form of a permanently magnetized region in order to establish a magnetic field strength (magnetic flux density) which can be detected when the at least one air flap is in the prescribed reference position, from the closed magnetic circuit which is formed. Preferably a plurality, and particularly all, of the regions which form a closed magnetic circuit when they are in magnetic continuity, are permanently magnetized.

A region comprised of magnetizable or permanently magnetized material may be constructed from a solid body of such material, wherewith preferably the air flap itself is comprised primarily of thermoplastic plastic material, which in particular may be fabricated by means of injection molding. The region in the form of a solid body may embedded in the plastic material of the at least one air flap and/or of the air flap frame, wherewith to produce magnetic continuity with another region comprised of magnetizable or permanently magnetized material, contact regions of said solid body are provided which are exteriorly free and open.

Only if a permanently magnetized region of an air flap is itself the detection section may it be possible to avoid providing contact regions which are exteriorly free and open. Under these circumstances, the solid body comprised of magnetizable or permanently magnetized material may be completely surrounded by the plastic material (or other material) of the air flap. In this case, it will not be possible to produce magnetic continuity between different regions on different components, and thus if a plurality of air flaps are provided, it will be necessary to supply a Hall effect sensor for each air flap.

Alternatively to, or in addition to, providing a region which is in the form of a solid body of magnetizable or permanently magnetized material, the region comprised of magnetizable or permanently magnetized material may be in the form of plastic which is filled with ferrimagnetic or ferromagnetic particle material. The preferred such filling material for plastics is magnetite, because it has high magnetization relative to the particle volume.

By employing filled plastic material, the region comprised of magnetizable or permanently magnetized material may be fabricated by injection molding, wherewith the at least one air flap can be fabricated overall in a single injection molding step.

The regions having magnetizable or permanently magnetized material are preferably fabricated as strips, and may have a dimension in the direction of travel which is substantially greater than the dimension orthogonal to this. The direction of travel may vary locally, because the region itself may have an angled or curved shape, particularly when a plurality of regions are in magnetic continuity with each other and form a closed magnetic circuit. Preferably, the only regions of the arrangement of air flaps which are comprised of magnetizable or permanently magnetized material are the aforesaid regions, with the other parts of the arrangement of air flaps being free of such material, and preferably being comprised of thermoplastic plastic.

The drive means for moving the at least one air flap relative to the air flap frame preferably comprises an actuator which is connected to the at least one air flap so as to transmit force and movement. The actuator may be coupled to a superordinate control device of the vehicle bearing the arrangement of air flaps, to control the actuator in on and off statuses. Advantageously, the Hall effect sensor may be accommodated in the actuator in order to save installation space. E.g., the Hall effect sensor may be disposed in a housing of the actuator. The means employed by the actuator to transmit force and movement to the at least one air flap may be any suitable means, exploiting any suitable principles. The actuator may be an electromagnetic, electromagnetic, pneumatic, or even hydraulic actuator. Preferably, the actuator is an electromotive or electromagnetic actuator.

The present invention also relates to a vehicle having an air flap of a design as described above, and with the relevant refinements, wherein the Hall effect sensor is coupled to a control device of the vehicle, for transmission of the detection signal from said sensor to, in particular, an onboard diagnostic module of said control device.

These and other objects, aspects, features and advantages of the invention will become apparent to those skilled in the art upon a reading of the Detailed Description of the invention set forth below taken together with the drawing which will be described in the next section.

BRIEF DESCRIPTION OF THE DRAWING

The invention may take physical form in certain parts and arrangement of parts, a preferred embodiment of which will be described in detail and illustrated in the accompanying drawing which forms a part hereof and wherein.

DESCRIPTION OF PREFERRED EMBODIMENTS

Figure 1:
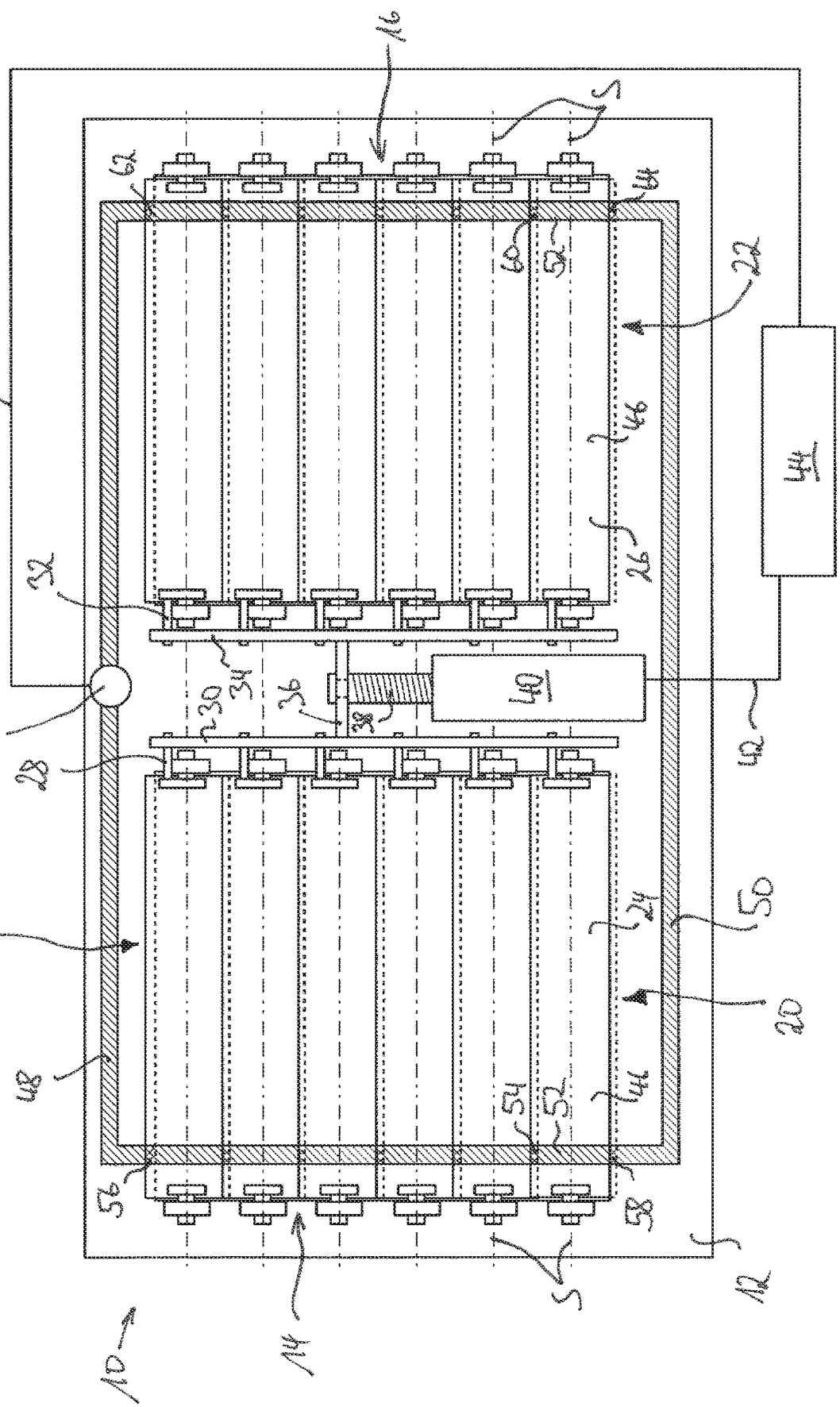
FIG. 1 is a schematic plan view of an inventive arrangement of air flaps with a plurality of air flaps in the closed position (closed status)
Figure 2:
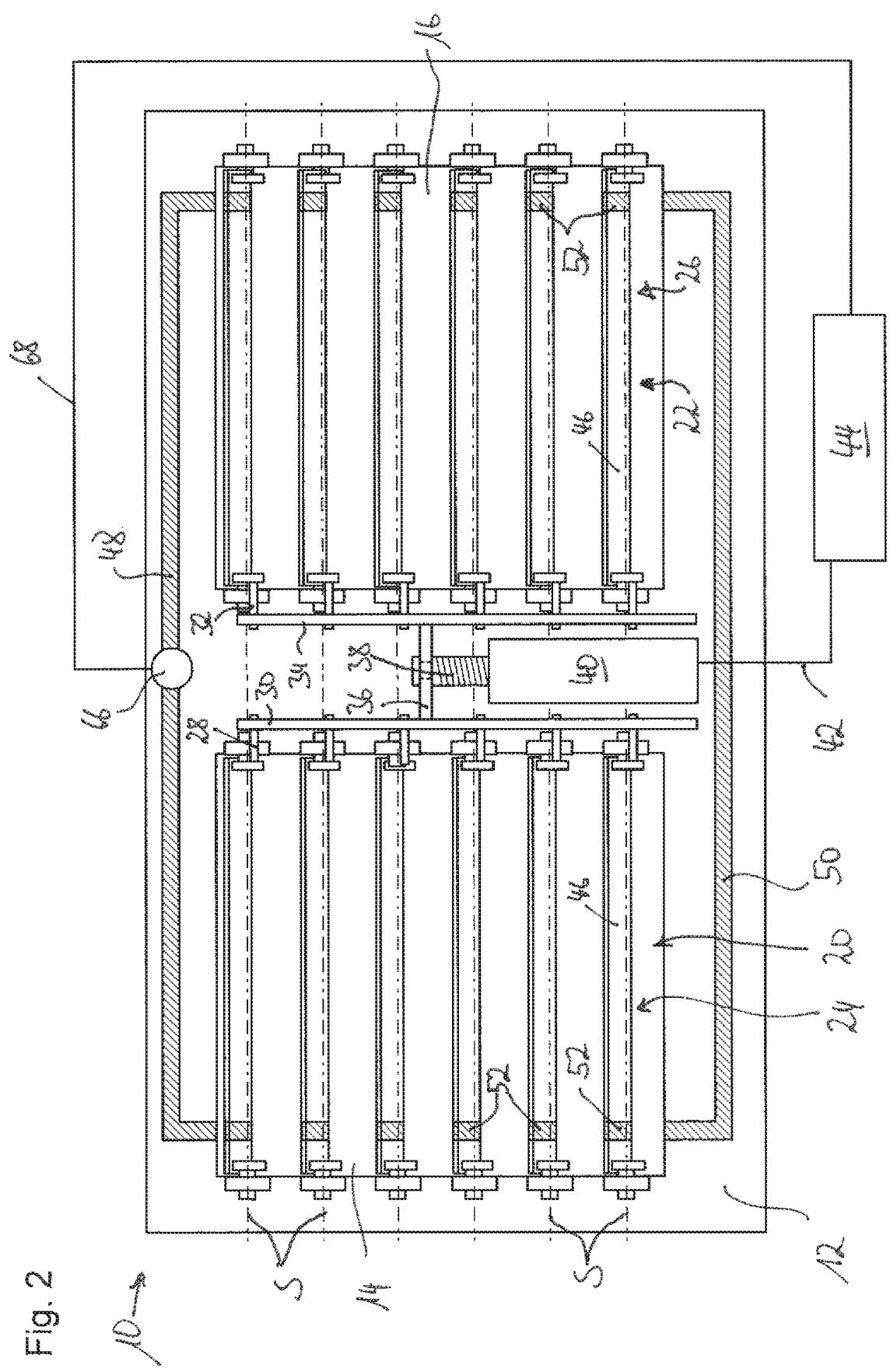
FIG. 2 illustrates the arrangement of air flaps according to FIG. 1, with the air flaps in the open position (open status), wherein material can flow through the through-flow opening of the arrangement of air flaps or air flap frame in a direction orthogonal to the plane of FIG. 2.

Referring now to the drawing wherein the showings are for the purpose of illustrating preferred and alternative embodiments of the invention only and not for the purpose of limiting the same, FIGS. 1 and 2 show an inventive arrangement of air flaps that is designated generally by the reference numeral 10. This is comprised of, in known fashion, an air flap frame 12 in which a through-flow opening 18 is provided which preferably is divided into through-flow openings 14, 16 of equal size.

The air flap frame 12 is preferably in the form of an injection molded component, fabricated by injection molding of thermoplastic plastic.

A first group 20 and a second group 22 of air flaps 24, 26 are disposed on the air flap frame 12; said air flaps are swingable around swing axes S which are parallel to each other.

The first group 20 of air flaps 24 is comprised of six air flaps 24 disposed in a vertical array (as an example), wherewith for purposes of simplicity in depiction only the lowest air flap 24 has been labeled with the reference numeral, 24.

The second group 22 of air flaps 26 is also comprised of six air flaps 26 disposed in a vertical array (as an example), wherewith the slats are arranged in a manner which is a mirror image of the arrangement of the air flaps 24, with respect to a plane of symmetry which is orthogonal to the plane of FIG. 1 and is disposed between the groups 20 and 22 of air flaps 24 and 26.

FIG. 1 illustrates how the slats of the first group 20 of air flaps 24 in their closed position shown in FIG. 1 have closed off the first part 14 of the through-flow opening 18, and the slats of the second group 22 of air flaps 26 in their closed position have closed off the second part 16 of the through-flow opening.

The air flaps 24 and 26 overlap in the closed position, with the outermost air flaps 24 also overlapping the air flap frame, so as to reach a defined closed status and to achieve the highest possible degree of sealing in the closed status. The same applies to the air flaps 26 in the second group 22.

The swing axes S of the first and second air flaps 24 and 26 are pairwise collinear. This means that the uppermost air flaps 24 and 26 have a collinear swing axis, the next pair of air flaps 24 and 26 below these have a respective collinear swing axis, etc.

An actuating member 28 extends from each air flap, parallel to the swing axis S. The actuating members 28 of the air flaps 24 of the first group 20 are interconnected by means of a connecting rod 30, for common movement and force transmission.

Also, in a mirror image of the actuating members 28 of the air flaps 24, each air flap 26 of the second group 22 has an actuating member 32 extending from it which is parallel to the swing axis S. The actuating members 32 of the air flaps 26 of the second group 22 are [also] interconnected, for common movement, by a connecting rod 34. The actuating members 28 and 32 are rotatably accommodated by [lit., "in"] their respective connecting rods 30 and 34, so as to be rotatable with respect to said rods.

The connecting rods 30 and 34 are interconnected by a coupling rod 36 which in turn is coupled to the shaft 38 of a worm drive 40, to be susceptible to common axial movement. The worm drive 40 is in the form of an electric motor driven actuator capable of moving the air flaps 24 and 26 between the closed status illustrated in FIG. 1 and the open status illustrated in FIG. 2. It is not necessary that the actuators of the air flaps 24 and 26 be driven by a worm drive. The drive means may be a rotational electric motor, or a piston and cylinder arrangement which arrangement is driven by hydraulic means or electric motor means.

The actuator in the form of the worm drive 40 is connected to a control device 44 via a signal transmission line 42, which control device controls the movement of the actuator 40 via said line 42. The means of energy supply to the actuator 40 is not shown. At least part of such energy supply may itself be provided through the signal transmission line 42.

The air flap bodies 46 of the air flaps 24 and 26 are identically configured, with a flat lamellar shape.

As shown in FIG. 1, the air flap frame 12 has a first region 48 and a second region 50 which are comprised of magnetizable or permanently magnetized material, wherewith the material of the air flap frame 12 outside the regions 48 and 50 is not magnetizable and not permanently magnetized. The regions 48 and 50 in the present example are comprised of permanently magnetized material in the form of strips disposed on the air flap frame 12 [lit., "21"]. In the example illustrated, preferably they are comprised of plastic material with a filling comprised of magnetite particles, wherewith for purposes of compatibility the matrix plastic of the magnetite-filled regions 48 and 50 is comprised of the same plastic as the other regions of the air flap frame 12 which do not have a magnetite filling.

FIGS. 1 and 2 illustrate the arrangement of air flaps 10 viewed from the direction of a vehicle interior in which, e.g., the arrangement of air flaps 10 may be disposed. In the case of air streams due to driving of the vehicle in which the arrangement of air flaps 10 is disposed (FIG. 2 [sic]), said air streams will flow through the parts 14 and 16 of the through-flow opening 18 in a direction orthogonal to the plane of FIG. 1.

Therefore, the externally protected permanently magnetized regions 48 and 50 can be exposed in the direction toward the observer and may form part of the surface of the air flap frame 12 facing the observer, in FIGS. 1 and 2. Thus, the regions 48 and 50 may be surrounded on three sides by plastic material of the air flap frame, which frame is not itself comprised of any magnetizable or permanently magnetized material.

Each air flap 24, 26 has on its air flap body 46 a strip of magnetizable or permanently magnetized material which extends over the entire width of the slat body 46. Preferably this material is comprised of plastic filled with magnetite particles and (which are) permanently magnetized. These strips thus form permanent magnet regions 52 of the slat bodies 46 of the air flaps 24 and 26.

Then, when, as in FIG. 1, the air flaps 24 and 26 are in their closed position, as the predetermined reference position, the permanent magnet regions 52 of neighboring air flaps 24, which regions are directly orthogonal to their pivot axes S of the slats, are in contact with each other in overlapping regions 54. This physical contact of the permanent magnet regions 52 results in magnetic continuity between the permanent magnet areas 52.

Similarly, the permanent magnet region 52 of the uppermost air flap 24 (FIG. 1) overlaps and physically contacts the permanently magnetized region 48 of the air flap frame 12 in an overlapping region 56.

Similarly, the permanent magnet region 52 of the lowermost air flap 24 (FIG. 1) overlaps and physically contacts the permanently magnetized region 50 of the air flap frame 12 in an overlap region 58.

Similarly, the permanent magnet region 52 of each air flap 26 overlaps and physically contacts the permanently magnetized regions 52 of the immediately neighboring (adjacent) air flaps 26, which slats are disposed in directions orthogonal to the swing axis S of said first-mentioned air flap 26, which overlapping and contacting is in an overlap region 60.

The permanent magnet region 52 of the uppermost air flap 26, when said slat is in its closed position (FIG. 1), contacts not only the permanent magnet region 52 of the immediately neighboring air flap 26 located below it, but also the first permanently magnetized region 48 of the air flap frame 12. This contact takes place in an overlap region 62.

In the same way, the permanent magnet section 52 of the lowermost air flap 26 (FIG. 1), when in the closed state, overlaps and contacts the second permanently magnetized region 50 of the air flap frame 12, in an overlap region 64.

As a result of the described physical contacts between the magnetized regions 48, 50, and 52, the said regions 48, 50, and 52 form a closed magnetic circuit, due to their configuration when the air flaps 24 and 26 are in the closed status.

In FIG. 2, the arrangement of air flaps 10 is illustrated in the open status (open position), wherein an air gap prevails between the permanent magnet areas 52 of the air flaps 24 and of the air flaps 26, which provides a substantially higher magnetic resistance than in the instance of physical contact of the regions 48, 50, and 52 in the closed status illustrated in FIG. 1.

Thus, at each position of the magnetized regions 48, 50, and 52 of the arrangement of air flaps 10, the magnetic flux density around the permanently magnetized regions is changed, when magnetic continuity between them is established, in the closed status illustrated in FIG. 1, compared to a situation in which the air flaps 24 and 26 are not in the closed position and thus an air gap prevails between the permanently magnetized regions 48, 50, and 52.

To detect this change in the magnetic flux density, advantageously a Hall effect sensor 66 is disposed in a region of the air flap frame 12 which is essentially remote from the through-flow opening 18 on the shadow side (downstream side) of the air flap frame 12 facing away from the inflow side, in which region in which the Hall effect sensor is disposed said sensor is safe from soils carried by the air stream due to driving. The region 48 in the air flap frame 12 thus forms a sensing region of the arrangement of air flaps 10 in which region 48 the Hall effect sensor 66 detects the magnetic flux density. The detection signal of the Hall effect sensor 66 is transmitted to the control device 44 via a signal transmission line 68.

Given that the Hall effect sensor 66 can supply a signal which is proportional to the magnetic flux density of the detection section 48, a "malfunction-free threshold value" can be stored in the control device 44, to which the detection signal of the Hall effect sensor 66 may be compared. If, e.g., the detection signal delivered by the Hall effect sensor exceeds said malfunction-free threshold value, the control device 44 will arrive at the evaluation that the arrangement of air flaps 10 is functioning properly (without malfunctioning).

One or more additional threshold values can be stored in the control device 44, which threshold values can be used for further evaluations. For example, a second "malfunction-free threshold value" can be input which corresponds to the detection value delivered by the Hall effect sensor 66 when the air flaps 24 and 26 are all in the open position. However, the abovementioned first "malfunction-free threshold value" is more significant, because it helps to detect an incorrect position of any individual air flap 24 or 26. If, when [the slats are nominally] shifted into the open position, nonetheless an air flap 24 or 26 which is disposed at some (any) distance from the regions 48 and 50 remains in its closed position, instead of being shifted to the open position as intended, this will not be detected via the second error-free threshold value.

A number of additional threshold values can be defined which are associated with the closed status, which values can be brought into operation ("triggered"), depending on how many air flaps 24 and/or 26 are not in the closed position despite the fact that they should be in the closed position. Thus, not only can the fact of a malfunction be detected, but the malfunction can also be quantified, in the control device 44, from the detection signal of the Hall effect sensor 66—within certain limits.

Thus, an "onboard diagnosis" of the arrangement of air flaps 10 is possible even with the use of only a single Hall effect sensor 66, if in different groups of air flaps separate parts of a through-flow opening are open or closed with respect to flow through them.

While considerable emphasis has been placed on the preferred embodiments of the invention illustrated and described herein, it will be appreciated that other embodiments, and equivalences thereof, can be made and that many changes can be made in the preferred embodiments without departing from the principles of the invention. Furthermore, the embodiments described above can be combined to form yet other embodiments of the invention of this application. Accordingly, it is to be distinctly understood that the foregoing descriptive matter is to be interpreted merely as illustrative of the invention and not as a limitation.

The invention claimed is:

1. An arrangement of air flaps for a motor vehicle, comprising an air flap frame which surrounds a through-flow opening, and at least one air flap which is movably mounted relative to the air flap frame, for changing an effective through-flow area of said through-flow opening, said at least one air flap at least protruding into the through-flow opening; the arrangement of air flaps further including a Hall effect sensor and a detection section which comprises magnetizable material and cooperates with a detection area of the Hall effect sensor in such a manner that, the Hall effect sensor that detects a magnetic field emanating from the detection section, emits a first detection signal when the at least one air flap is in a prescribed reference position relative to the air flap frame, the Hall sensor emits a second detection signal when the at least one air flap is not in the prescribed position, the second detection signal is different from the first detection signal emitted by the Hall effect sensor, wherein the at least one air flap has a magnetic flap section that includes permanently magnetized material, the magnetic flap section being movable together with the at least one air flap relative to the air flap frame, wherein the detection section is a magnetizable region but not a permanently magnetized region, and wherein when the at least one air flap is in the prescribed reference position the magnetic flap section of the at least one air flap is in magnetic continuity with the detection section thereby changing the magnetic field emanating from the detection section which is detectable by that Hall effect sensor such that the Hall effect sensor emits the first detection signal.

2. The arrangement of air flaps according to claim 1; wherein said at least one air flap extends across said through-flow opening.

3. The arrangement of air flaps according to claim 1; wherein the detection section is fixed relative to the air flap frame.

4. The arrangement of air flaps according to claim 1; wherein the at least one air flap is a plurality of air flaps which are coupled together for common movement relative to the air flap frame, wherein each one of the plurality of air flaps includes a magnetic flap section with magnetizable or permanently magnetized material, wherein the magnetic flap sections of the plurality of air flaps are in magnetic continuity with each other when the plurality of air flaps are in the prescribed reference position.

5. The arrangement of air flaps according to claim 4; wherein the magnetic flap section of at least one air flap of the plurality of air flaps comprises a permanently magnetized material.

6. The arrangement of air flaps according to claim 4; wherein the magnetic flap section of the plurality of air flaps comprises a permanently magnetized material.

7. The arrangement of air flaps according to claim 1; wherein the detection section comprises a plurality of sections having magnetizable or permanently magnetized material, at least one of said plurality of sections is permanently magnetized, wherein the plurality of sections have magnetic continuity such that they form a closed magnetic circuit when the at least one air flap is in the prescribed reference position.

8. The arrangement of air flaps according to claim 1; wherein at least one of the detection section and the magnetic flap section of magnetizable or permanently magnetized material comprises a solid body of such material which is embedded in a plastic material of the at least one air flap or the air flap frame, with contact regions which are exteriorly free and open.

9. The arrangement of air flaps according to claim 1; wherein at least one of the detection section and the magnetic flap section of magnetizable or permanently magnetized material is formed of at least one of ferrimagnetic plastic and ferromagnetic particle material filled plastic.

10. The arrangement of air flaps according to claim 9; wherein the at least one of ferrimagnetic plastic and ferromagnetic particle material filled plastic is or comprises magnetite.

11. The arrangement of air flaps according to claim 1; wherein the at least one air flap is coupled to an actuator which serves as a motion drive for moving the at least one air flap relative to the air flap frame, and the Hall effect sensor is disposed in the actuator.

12. A vehicle having an arrangement of air flaps according to claim 1; wherein the Hall effect sensor is in communication with a control device of the vehicle, for the purpose of transmission of the first and second detection signals of said Hall effect sensor to the control device.

13. The vehicle having an arrangement of air flaps according to claim 12; wherein the control device includes an onboard diagnosis module and the Hall effect sensor is coupled to the onboard diagnosis module for the purpose of the transmission of the first and second detection signals of said Hall effect sensor.

14. A vehicle having an arrangement of air flaps comprising an air flap frame which surrounds a through-flow opening, and at least one air flap which is movably mounted relative to the air flap frame, for changing an effective through-flow area of said through-flow opening, said at least one air flap at least protruding into the through-flow opening; the arrangement of air flaps further including a Hall effect sensor and a detection section which comprises magnetizable material and cooperates with a detection area of the Hall effect sensor in such a manner that, the Hall effect sensor that detects a magnetic field emanating from the detection section, emits a first detection signal when the at least one air flap is in a prescribed reference position relative to the air flap frame, the Hall sensor emits a second detection signal when the at least one air flap is not in the prescribed position, the second detection signal is different from the first detection signal emitted by the Hall effect sensor, wherein the at least one air flap has a magnetic flap section that includes permanently magnetized material, the magnetic flap section being movable together with the at least one air flap relative to the air flap frame, wherein the detection section is a magnetizable region but not a permanently magnetized region, and wherein the magnetic flap section of the at least one air flap is in magnetic continuity with the detection section, when the at least one air flap is in the prescribed reference position; wherein the Hall effect sensor is in communication with a control device of the vehicle, for the purpose of transmission of the first and second detection signals of said Hall effect sensor to the control device; wherein the at least one air flap is coupled to an actuator which serves as a motion drive for moving the at least one air flap relative to the air flap frame, the control device controlling the actuator based on the first and second detection signals transmitted by the Hall effect sensor; and wherein at least one of the detection section and the magnetic flap section of magnetizable or permanently magnetized material is formed of at least one of ferrimagnetic plastic and ferromagnetic particle material filled plastic.

\* \* \* \* \*